United States Patent [19]

Akiike et al.

[11] Patent Number: 5,540,807
[45] Date of Patent: Jul. 30, 1996

[54] BONDING APPARATUS

[75] Inventors: Tadashi Akiike; Minoru Kawagishi; Mitsuaki Sakakura, all of Tokyo, Japan

[73] Assignee: Kabushiki Kaisha Shinkawa, Tokyo, Japan

[21] Appl. No.: 346,414

[22] Filed: Nov. 29, 1994

[30] Foreign Application Priority Data

Nov. 30, 1993 [JP] Japan ................................ 5-326121

[51] Int. Cl.⁶ ................................................ B23K 1/06
[52] U.S. Cl. .................... 156/580.1; 228/1.1; 228/4.5; 228/110.1
[58] Field of Search ........................... 156/73.1, 580.1, 156/580.2; 264/23; 425/174.2; 228/1.1, 110.1, 4.5

[56] References Cited

U.S. PATENT DOCUMENTS

| | | | |
|---|---|---|---|
| 3,451,607 | 6/1969 | Miller et al. | 228/1.1 |
| 4,037,772 | 7/1977 | Dupuis | 228/1.1 |
| 4,040,885 | 8/1977 | Hight et al. | 156/378 |
| 4,266,710 | 5/1981 | Bilane et al. | 228/4.5 |
| 5,263,630 | 11/1993 | Kanomata et al. | 228/1.1 |
| 5,385,288 | 1/1995 | Kyomasu et al. | 228/1.1 |

*Primary Examiner*—David A. Simmons
*Assistant Examiner*—J. Sells
*Attorney, Agent, or Firm*—Koda and Androlia

[57] ABSTRACT

An ultrasonic horn of a bonding apparatus quipped with a bonding tool attached to one end of the horn and a vibration-generating source such as an electrostrictive strain element, magnetostrictor, etc. attached to a bonding arm that supports the bonding horn. The ultrasonic horn is further provided with a vertical vibration adjuster which adjusts the vertical component of the vibration of the ultrasonic horn, and the vertical vibration adjuster includes a projection, recess, etc. provided at the end of the horn.

4 Claims, 2 Drawing Sheets

BONDING APPARATUS

BACKGROUND OF THE INVENTION

1. Field of the Invention

The present invention relates to a semiconductor bonding apparatus such as a wire bonding apparatus using both nail-head ultrasound and heat and pressure bonding, an ultrasonic wedge type wire bonding apparatus, a single TAB bonding apparatus, etc., and more particularly to an ultrasonic horn equipped at one end with a bonding tool and at another end with a vibration-generating source such as an electrostrictive strain element, a magnetostrictor, etc.

2. Prior Art

A conventional nail-head heat and pressure type wire bonding apparatus is constructed, for example, as shown in FIG. 5.

A supporting shaft 2 is fastened to a bonding arm 1. The supporting shaft 2 is supported on a bonding head (not shown) either directly or via a lifter arm so as to be rotatable. The horn support 4 of an ultrasonic horn 3 is fastened to the bonding arm 1. The ultrasonic horn 3 essentially consists of a horn main body 6 having a bonding tool 5 through which a wire (not shown) is passed and a vibrator 7 which is screwed to the horn main body 6.

The vibrator 7 is of a structure in which a vibration-generating source 8 is attached by a screw fastening method known as a "Langevin" type system. The Langevin type assembly includes a horn attachment 9 which is attached to the horn main body 6, a vibration-generating source attachment shaft 10 which has external screws on the both ends so as to be screwed to the horn attachment 9, and an insulating pipe 11 which is fitted over the vibration-generating source 8.

In this conventional ultrasonic horn 3, the vibration-generating source 8 is attached on the other side of the horn support 4 from the bonding tool 5. The vibrator 7 is adjusted to a prescribed frequency by attaching the horn attachment 9 and nut 12 to the respective ends of the vibration-generating source 8. The acoustic length of the vibrator 7 must be an integral multiple of ½ wavelength. In this structure, however, there is no need for elongating the acoustic length; accordingly, a vibrator that has a ½ wavelength is used. The free end 13 of the vibrator 7 forms a vibrational belly (where the amplitude is large), and the horn attachment portion 14 of the horn attachment 9 also forms a belly, so that attachment is facilitated.

In operation, the vibration of the vibration-generating source 8 is transmitted throughout the ultrasonic horn 3 so that a standing-wave vibration is created in the ultrasonic horn 3, thus supplying the necessary energy to the bonding tool 5.

In an unloaded state (in which no bonding is being performed), energy accumulates in a stable manner. In a skillfully crafted ultrasonic horn 3, the dimensions are such that a node is at the horn support 4. Accordingly, even with the ultrasonic horn 3 attached to the bonding arm 1, there is little movement of the horn support 4, and therefore, little loss. In such an unloaded state, the ultrasonic horn 3 acts as a tuning fork with the horn support 4 receiving vibrations synmetrically from the left and right, so that the horn support 4 does not move to the left or right. The vibration-generating source 8 is ordinarily driven by constant-current driving, etc. so that the vibrational amplitude has a prescribed value. When energy is used for bonding by the bonding tool 5, the energy balance between the vibration-generating source side and the bonding tool side is destroyed so that the vibrational node moves, and the energy required in order to establish a balance is fed in. In this way, bonding utilizing ultrasonic waves is conducted.

In the conventional ultrasonic horn 3, the horn shows rough line symmetry with respect to the axis of the horn, and the bonding tool 5 is attached to the tip end of the horn so that the bonding tool is asymmetrical with respect to the axial center. As a result, the ultrasonic horn 3 makes its expansion and contraction only in the axial direction and move the bonding tool horizontally so as to provide energy with the bonding plane. However, due to the resistance between the bonding tool 5 and the bonding surface, it is impossible to achieve control that includes components other than horizontal components when the operation of the tip end of an actual bonding tool 5 is made. In other words, bonding which depends on the load and the bonding tool 5 is performed.

Recently, with the increased density of semiconductor devices, the addition of various chemical elements to the pad has become common in order to execute high-density wiring. As a result, pad surface shapes and oxide film structures have become diverse, and it has become difficult to maintain good bonding quality. The main causes of faulty bonding would appear to be the difficulty of diffusing the pad material and wire material, and the difficulty of destroying the oxide film. The method to solve these problems is to apply the required amount of ultrasonic energy to the pad regardless of the conditions of the pad surface.

As a result of tests, the inventors discovered that with the ultrasonic horns which have symmetrical structures with respect to the axial centers, it is not possible to provide stable ultrasonic energy with the bonding surface without regard to the conditions of the bonding surface.

The inventors found the reasons for such problems. The pad surfaces form various shapes as a result of crystals of the doped material or oxides of the same, and in some cases, a structure such as a ridge-form structure, etc. is formed which makes it difficult for the ball formed at the tip end of the wire passing through the bonding tool 5 to slip. Furthermore, in the conventional ultrasonic horns 3, as described above, only the axial direction of the ultrasonic horn 3 is considered important as the direction of vibration. Accordingly, in cases where only an axial force (energy) is applied to the bonding tool 5, stable frictional movement of the ball at the tip end of the bonding tool 5 becomes difficult to achieve. Thus, a stable bonding energy is not applied, resulting in faulty bonding.

SUMMARY OF THE INVENTION

The object of the present invention is to provide a bonding apparatus including an ultrasonic horn which can apply a stable bonding energy to the bonding surface, allowing a uniform formation of the alloy required for bonding and improving the bonding quality.

The object of the present invention is accomplished by a unique structure for a bonding apparatus in which an ultrasonic horn is equipped with: a bonding tool attached to one end of the horn, and a vibration-generating source such as an electrostrictive strain element or magnetostrictor, etc. attached to a bonding arm, and the unique structure is that the ultrasonic horn is further provided with a vertical vibration adjusting assembly which adjusts the vertical component of the vibration.

With the above structure, the direction of the vibration generated by the ultrasonic wave generating source of the ultrasonic horn is adjusted by the vertical vibration adjusting assembly not only in the axial direction component but also in the vertical direction component so as to stabilize the movement of the tip end of the bonding tool. More specifically, by adjusting the axial and vertical vibrational components, oblique direction vibrations are controlled, and as a result, it becomes possible to provide a stable application of bonding energy between the bonding surface and the ball.

DETAILED DESCRIPTION OF THE INVENTION

Figure 5:
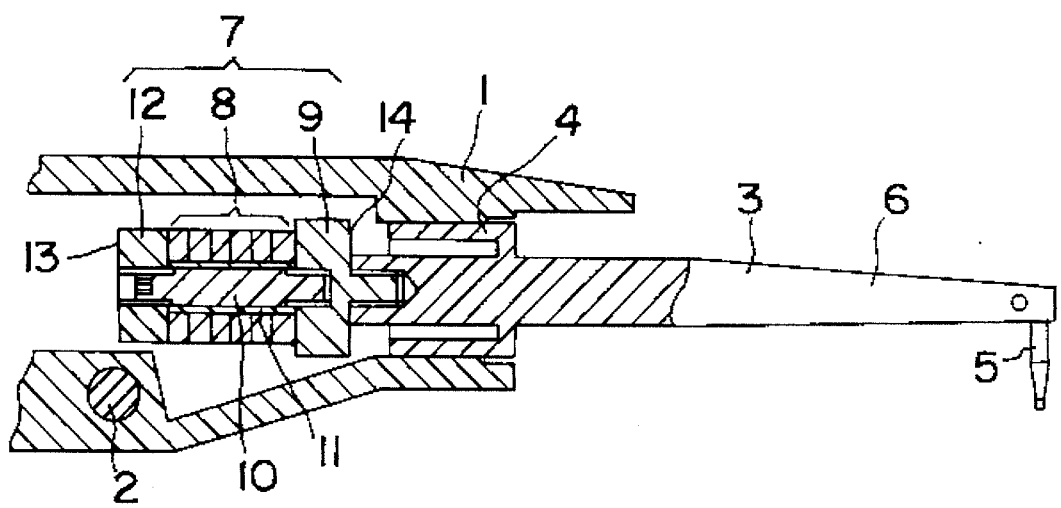
FIG. 5 is a partial cross section of the essential portion of the ultrasonic horn of a conventional bonding apparatus.

A first embodiment of the present invention will be described with reference to the accompanying drawings. Elements which are the same as or correspond to elements in FIG. 5 are labeled with the same reference numerals, and a detailed description of such elements is omitted.

Figure 1:
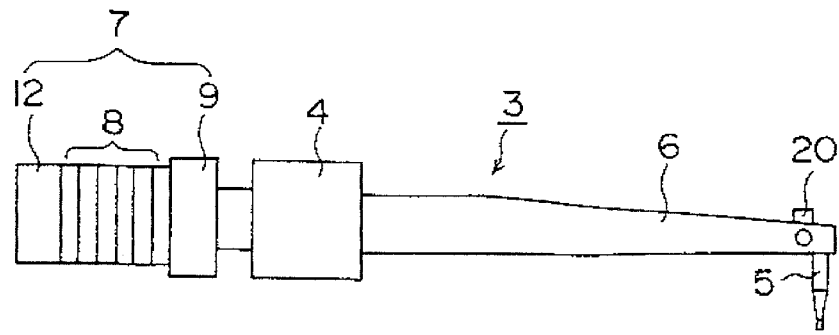
FIG. 1 is a side view of a first embodiment of the ultrasonic horn of the bonding apparatus of the present invention.

In the first embodiment of the present invention shown in FIG. 1, a weight 20 is attached to the tip end of the ultrasonic horn 3, i.e., to the upper surface of the tip end of the horn main body 6. With the weight 20 thus attached, the tip end of the horn main body 6 becomes a vibrational belly, and the vertical balance of the axial center of the ultrasonic horn 3 is adjusted so that the vibration generated by the ultrasonic wave generating source 8 of the ultrasonic horn 3 includes a vertical direction component (generated by the weight 20) in addition to an axial direction component.

In other words, the tip of the bonding tool 5 shows stable vibration by the axial vibrational component, by the vertical vibrational component generated by the weight 20, and by the vertical vibration component which originally exists in the bonding tool 5. Accordingly, even if a workpiece has a rough bonding surface, bonding energy can be applied in a stable fashion regardless of the frictional resistance between the bonding surface and the ball.

The inventors conducted tests, and the tests indicate that when the ball at the tip of the wire is pressed against a bonding surface by the conventional ultrasonic horn 3, the ball is pressed into a cylindrical form, and an alloy is formed only with difficulty in the vicinity of the central part but readily formed at the bonding surface around the periphery of the ball. On the other hand, with the horn of the present invention as described above, an alloy is formed evenly across the entire surface of a workpiece. For balls with a small bonding area which is required in high-density semiconductor devices and for semiconductor devices which are susceptible to cracking, etc., it is important to disperse the bonding force over the entire surface of the ball. In view of this, the horn according to the present invention has great merit.

Figure 2:
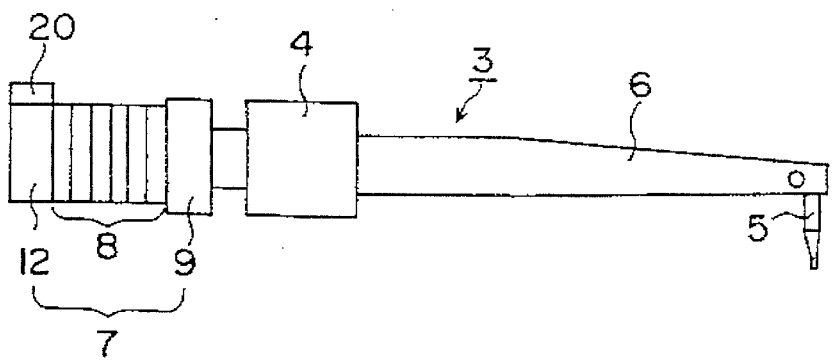
FIG. 2 is a side view of a second embodiment of the ultrasonic horn of the bonding apparatus of the present invention.

FIG. 2 illustrates a second embodiment of the present invention. In this embodiment, a weight 20 is attached to the rear end of the ultrasonic horn 3. In other words, the weight 20 is attached to the upper surface of nut 12 of the vibrator 7. Since the rear end area of the ultrasonic horn 3 is a vibrational belly, an effect same as that of the previous embodiment is obtained with the weight 20 that is attached to the rear end of the horn 3 as shown in FIG. 2.

It is generally known that ultrasonic horns create a plurality of vibrational bellies and nodes. In this regard, the weight 20 can be installed at an intermediate belly or node portion of the ultrasonic horn 3. Furthermore, instead of using the weight 20 that is a projection, it is possible to form a recess in the horn 3, and the projection or recess can be provided on the undersurface of the ultrasonic horn 3 instead of the upper surface as shown in the FIGS. 1 and 2. In addition, metals with different specific gravities can be installed on the upper and lower surfaces of the horn, respectively.

As seen from the above, a vertical vibration adjusting assembly which adjusts the vertical component of vibration can be obtained by forming a vibrational belly or node to be asymmetrical with respect to the vertical direction.

Figure 3:
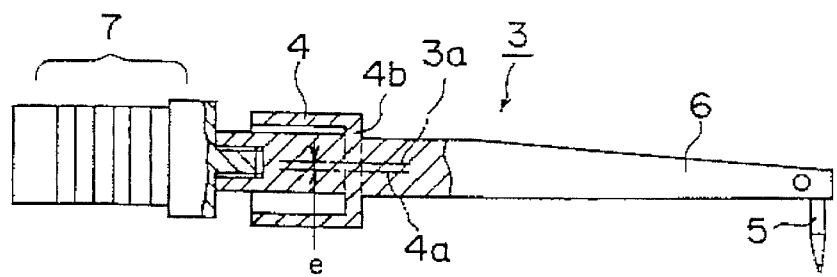
FIG. 3 is a partial cross section of the essential portion of a third embodiment of the ultrasonic horn of the bonding apparatus of the present invention.

FIG. 3 illustrates a third embodiment of the present invention.

In this embodiment, an asymmetrical shape is obtained inside the horn support 4, so that the horn support 4 has an offset 4a by an eccentricity of e with respect to the axial center 3a of the ultrasonic horn 3. By designing the horn like this, the length of the vibration transmitting part 4b of the horn support 4 can differ in the above and below the axial center 3a. Accordingly, the transmission of energy to the horn main body 6 becomes unequal in the portions of the vibration transmission part 4b located above and below the axial center 3a. Thus, the vibration generated includes a vertical direction component in addition to an axial direction component, and the effect same as the previous two embodiments is obtained.

Figure 4:
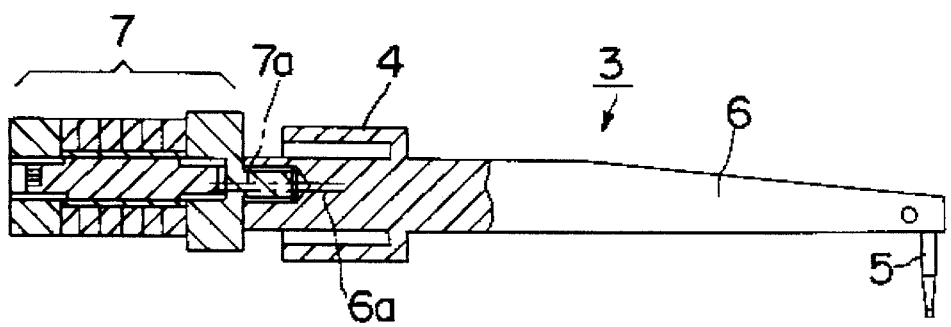
FIG. 4 is a partial cross section of the essential portion of a fourth embodiment of the ultrasonic horn of the bonding apparatus of the present invention.

FIG. 4 illustrates a fourth embodiment of the present invention that includes another type of the vertical vibration adjusting part.

In this embodiment, the axial center 7a of the vibrator 7 is shifted in the vertical direction with respect to the axial center 6a of the horn main body 6. In this embodiment, the vibration of the axial center 7a of the vibrator 7 is transmitted to the horn main body 6 as obliquely oriented vibrations so that vertical vibration is controlled. The effect same as the previous three (3) embodiments is obtained.

As seen from the above, in the present invention, the ultrasonic horn has a vertical vibration adjusting assembly which provides a vertical vibration component. Accordingly, a stable bonding energy is applied to the bonding surface, uniform formation of the alloy required for bonding is achievable, and the bonding quality is improved.

We claim:

1. A bonding apparatus comprising an ultrasonic horn equipped with a bonding tool which is attached to one end of said horn and a vibration-generating source which is an electrostrictive strain element or a magnetostrictor attached to a bonding arm wherein said ultrasonic horn is provided with a vertical vibration adjusting means which adjusts a vertical component of vibration said vertical vibration adjusting means is obtained by forming a vibration belly or node of said ultrasonic horn in a shape which is asymmetrical with respect to a vertical direction and said asymmetrical shape is obtained by forming a horn support of said ultrasonic horn to be eccentric with respect to a vertical direction.

2. A bonding apparatus comprising an ultrasonic horn equipped with a bonding tool which is attached to one end of said horn and a vibration-generating source which is an electrostrictive strain element or an magnetostrictor attached to a bonding arm, wherein said ultrasonic horn is provided with a vertical vibration adjusting means which adjusts a vertical component of vibration and said vertical vibration adjusting means is formed by attaching a vibrator so that an axial center of said vibrator is vertically offset from an axial center of said horn main body.

3. A bonding apparatus comprising a bonding arm that is provided with an ultrasonic horn equipped at one end with a bonding tool and at another end with a vibration-generating source, said ultrasonic horn being further provided with a vertical vibration adjusting means which adjusts a vertical component of vibration, and wherein said vibration-generating source is one selected from the group consisting of an eletrostrictive strain element and a magnetostrictor, said vertical vibration adjusting means is obtained by forming a vibrational belly or node of said ultrasonic horn to an asymmetrical shape with respect to a vertical direction, and said asymmetrical shape is obtained by a recess formed in an upper end surface of said horn.

4. A bonding apparatus comprising a bonding arm that is provided with an ultrasonic horn equipped at one end with a bonding tool and at another end with a vibration-generating source, said ultrasonic horn being further provided with a vertical vibration adjusting means which adjusts a vertical component of vibration, and wherein said vibration-generating source is one selected from the group consisting of an electrostrictive strain element and a magnetostrictor, said vertical vibration adjusting means is obtained by forming a vibrational belly or node of said ultrasonic horn to an asymmetrical shape with respect to a vertical direction and said asymmetrical shape is obtained by two metal pieces of different specific gravities provided in said horn, one of said metal pieces being provided is an upper surface of said horn and another of said metal pieces being provided on an under surface of said horn.

* * * * *